(12) United States Patent
Pendse

(10) Patent No.: US 9,159,665 B2
(45) Date of Patent: *Oct. 13, 2015

(54) FLIP CHIP INTERCONNECTION HAVING NARROW INTERCONNECTION SITES ON THE SUBSTRATE

(71) Applicant: STATS ChipPAC, Ltd., Singapore (SG)

(72) Inventor: Rajendra D. Pendse, Fremont, CA (US)

(73) Assignee: STATS ChipPAC, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/645,397

(22) Filed: Oct. 4, 2012

(65) Prior Publication Data

US 2013/0026628 A1 Jan. 31, 2013

Related U.S. Application Data

(63) Continuation of application No. 12/757,889, filed on Apr. 9, 2010, now Pat. No. 8,318,537, which is a continuation of application No. 11/388,755, filed on Mar. 24, 2006, now abandoned.

(60) Provisional application No. 60/665,208, filed on Mar. 25, 2005.

(51) Int. Cl.
*H01L 21/60* (2006.01)
*H01L 23/488* (2006.01)
(Continued)

(52) U.S. Cl.
CPC ........ *H01L 23/49838* (2013.01); *H01L 21/563* (2013.01); *H01L 23/49811* (2013.01); *H01L 24/29* (2013.01); *H01L 24/81* (2013.01);
(Continued)

(58) Field of Classification Search
USPC .......................................................... 438/615
See application file for complete search history.

(56) References Cited

U.S. PATENT DOCUMENTS 5,186,383 A 2/1993 Melton et al.
5,340,435 A 8/1994 Ito et al.
(Continued)

FOREIGN PATENT DOCUMENTS

JP 04-355933 9/1992
JP 0528037 4/1993
(Continued)

OTHER PUBLICATIONS

Yamada, Hiroshi et al., "Advanced copper column based solder bump for flip-chip interconnection", International Symposium on Microelectronics, 1997, pp. 417-422, The British Library—"The world's knowledge".

(Continued)

*Primary Examiner* — Stephen W Smoot
(74) *Attorney, Agent, or Firm* — Robert D. Atkins; Patent Law Group: Atkins and Associates, P.C.

(57) ABSTRACT

A flip chip interconnect of a die on a substrate is made by mating the interconnect bump onto a narrow interconnect pad on a lead or trace, rather than onto a capture pad. The width of the narrow interconnect pad is less than a base diameter of bumps on the die to be attached. Also, a flip chip package includes a die having solder bumps attached to interconnect pads in an active surface, and a substrate having narrow interconnect pads on electrically conductive traces in a die attach surface, in which the bumps are mated onto the narrow pads on the traces.

27 Claims, 9 Drawing Sheets

(51) Int. Cl.
  *H01L 23/498* (2006.01)
  *H01L 21/56* (2006.01)
  *H01L 23/00* (2006.01)
  *H05K 1/11* (2006.01)
  *H05K 3/34* (2006.01)

(52) U.S. Cl.
  CPC ...... *H05K1/111* (2013.01); *H01L 2224/13013* (2013.01); *H01L 2224/13111* (2013.01); *H01L 2224/13144* (2013.01); *H01L 2224/1607* (2013.01); *H01L 2224/16225* (2013.01); *H01L 2224/16237* (2013.01); *H01L 2224/16238* (2013.01); *H01L 2224/32225* (2013.01); *H01L 2224/73203* (2013.01); *H01L 2224/73204* (2013.01); *H01L 2224/8121* (2013.01); *H01L 2224/81136* (2013.01); *H01L 2224/81193* (2013.01); *H01L 2224/81204* (2013.01); *H01L 2224/81211* (2013.01); *H01L 2224/81385* (2013.01); *H01L 2224/81815* (2013.01); *H01L 2224/83102* (2013.01); *H01L 2224/83192* (2013.01); *H01L 2224/83856* (2013.01); *H01L 2224/92125* (2013.01); *H01L 2924/00013* (2013.01); *H01L 2924/014* (2013.01); *H01L 2924/01005* (2013.01); *H01L 2924/01006* (2013.01); *H01L 2924/01033* (2013.01); *H01L 2924/01046* (2013.01); *H01L 2924/01074* (2013.01); *H01L 2924/01075* (2013.01); *H01L 2924/01078* (2013.01); *H01L 2924/01079* (2013.01); *H01L 2924/01082* (2013.01); *H01L 2924/01322* (2013.01); *H01L 2924/14* (2013.01); *H01L 2924/3011* (2013.01); *H05K 3/3452* (2013.01); *H05K 2201/0989* (2013.01); *H05K 2201/09427* (2013.01); *H05K 2201/09727* (2013.01); *H05K 2201/10674* (2013.01)

(56) References Cited

U.S. PATENT DOCUMENTS

| | | | |
|---|---|---|---|
| 5,378,859 A | 1/1995 | Shirasaki et al. | |
| 5,383,916 A | 1/1995 | Brown | |
| 5,386,624 A | 2/1995 | George et al. | |
| 5,434,410 A | 7/1995 | Kulwicki | |
| 5,508,561 A | 4/1996 | Tago et al. | |
| 5,519,580 A | 5/1996 | Natarajan et al. | |
| 5,587,337 A | 12/1996 | Idaka et al. | |
| 5,650,595 A | 7/1997 | Bentlage et al. | |
| 5,710,071 A | 1/1998 | Beddingfield et al. | |
| 5,795,818 A | 8/1998 | Marrs | |
| 5,798,285 A | 8/1998 | Bentlage et al. | |
| 5,844,782 A | 12/1998 | Fukasawa | |
| 5,854,514 A | 12/1998 | Roldan et al. | |
| 5,869,886 A | 2/1999 | Tokuno | |
| 5,872,399 A | 2/1999 | Lee | |
| 5,889,326 A | 3/1999 | Tanaka | |
| 5,915,169 A | 6/1999 | Heo | |
| 5,985,456 A | 11/1999 | Zhou et al. | |
| 6,002,172 A | 12/1999 | Desai et al. | |
| 6,049,122 A | 4/2000 | Yoneda | |
| 6,109,507 A | 8/2000 | Yagi et al. | |
| 6,149,122 A | 11/2000 | Berger et al. | |
| 6,201,305 B1 | 3/2001 | Darveaux et al. | |
| 6,218,630 B1 | 4/2001 | Takigami | |
| 6,228,466 B1 | 5/2001 | Tsukada et al. | |
| 6,229,209 B1 | 5/2001 | Nakamura et al. | |
| 6,229,220 B1 | 5/2001 | Saitoh et al. | |
| 6,229,711 B1 | 5/2001 | Yoneda | |
| 6,251,704 B1 * | 6/2001 | Ohuchi et al. | 438/108 |
| 6,259,159 B1 * | 7/2001 | Dalal et al. | 257/738 |
| 6,259,163 B1 | 7/2001 | Ohuchi et al. | |
| 6,281,107 B1 | 8/2001 | Moriyama | |
| 6,281,450 B1 | 8/2001 | Urasaki et al. | |
| 6,281,581 B1 | 8/2001 | Desai et al. | |
| 6,297,560 B1 | 10/2001 | Capote et al. | |
| 6,324,754 B1 | 12/2001 | DiStefano et al. | |
| 6,329,605 B1 | 12/2001 | Beroz et al. | |
| 6,333,206 B1 | 12/2001 | Ito et al. | |
| 6,335,222 B1 | 1/2002 | DiStefano | |
| 6,335,568 B1 | 1/2002 | Yuzawa et al. | |
| 6,335,571 B1 | 1/2002 | Capote et al. | |
| 6,383,916 B1 | 5/2002 | Lin | |
| 6,396,707 B1 | 5/2002 | Huang et al. | |
| 6,409,073 B1 | 6/2002 | Kaskoun et al. | |
| 6,441,316 B1 | 8/2002 | Kusui | |
| 6,448,665 B1 | 9/2002 | Nakazawa et al. | |
| 6,458,622 B1 | 10/2002 | Keser et al. | |
| 6,459,622 B1 | 10/2002 | Ogura et al. | |
| 6,462,425 B1 | 10/2002 | Iwasaki et al. | |
| 6,472,608 B2 | 10/2002 | Nakayama | |
| 6,492,255 B2 * | 12/2002 | Enomoto et al. | 438/614 |
| 6,495,397 B2 | 12/2002 | Kubota et al. | |
| 6,510,976 B2 | 1/2003 | Hwee et al. | |
| 6,518,674 B2 * | 2/2003 | Interrante et al. | 257/772 |
| 6,518,678 B2 | 2/2003 | James et al. | |
| 6,550,666 B2 | 4/2003 | Chew et al. | |
| 6,556,268 B1 | 4/2003 | Lee et al. | |
| 6,563,712 B2 | 5/2003 | Akram et al. | |
| 6,573,610 B1 | 6/2003 | Tsai | |
| 6,578,754 B1 | 6/2003 | Tung | |
| 6,592,019 B2 | 7/2003 | Tung | |
| 6,600,234 B2 | 7/2003 | Kuwabara et al. | |
| 6,608,388 B2 | 8/2003 | Lin et al. | |
| 6,642,079 B1 * | 11/2003 | Liu et al. | 438/108 |
| 6,660,560 B2 | 12/2003 | Chaudhuri et al. | |
| 6,661,084 B1 | 12/2003 | Peterson et al. | |
| 6,664,483 B2 | 12/2003 | Chong et al. | |
| 6,678,948 B1 | 1/2004 | Benzler et al. | |
| 6,681,982 B2 | 1/2004 | Tung | |
| 6,710,458 B2 | 3/2004 | Seko | |
| 6,734,557 B2 | 5/2004 | Taniguchi et al. | |
| 6,768,190 B2 | 7/2004 | Yang et al. | |
| 6,774,474 B1 | 8/2004 | Caletka et al. | |
| 6,774,497 B1 | 8/2004 | Qi et al. | |
| 6,780,673 B2 | 8/2004 | Venkateswaran | |
| 6,780,682 B2 | 8/2004 | Pendse | |
| 6,787,918 B1 | 9/2004 | Tsai et al. | |
| 6,798,072 B2 | 9/2004 | Kajiwara et al. | |
| 6,809,262 B1 * | 10/2004 | Hsu | 174/558 |
| 6,818,545 B2 | 11/2004 | Lee et al. | |
| 6,821,878 B2 | 11/2004 | Danvir et al. | |
| 6,849,944 B2 | 2/2005 | Murtuza et al. | |
| 6,853,076 B2 | 2/2005 | Datta et al. | |
| 6,870,276 B1 | 3/2005 | Moxham et al. | |
| 6,888,255 B2 | 5/2005 | Murtuza et al. | |
| 6,913,948 B2 | 7/2005 | Caletka et al. | |
| 6,927,489 B1 | 8/2005 | Yaguchi et al. | |
| 6,943,058 B2 | 9/2005 | Chaudhuri et al. | |
| 7,005,585 B2 | 2/2006 | Ishizaki | |
| 7,005,743 B2 | 2/2006 | Iwatsu et al. | |
| 7,005,750 B2 | 2/2006 | Liu | |
| 7,049,705 B2 | 5/2006 | Huang | |
| 7,057,284 B2 | 6/2006 | Chauhan et al. | |
| 7,064,435 B2 | 6/2006 | Chung et al. | |
| 7,098,407 B2 | 8/2006 | Kim et al. | |
| 7,101,781 B2 | 9/2006 | Ho et al. | |
| 7,102,222 B2 | 9/2006 | Kuo et al. | |
| 7,102,239 B2 | 9/2006 | Pu et al. | |
| 7,112,524 B2 | 9/2006 | Hsu et al. | |
| 7,164,208 B2 | 1/2007 | Kainou et al. | |
| 7,173,828 B2 | 2/2007 | Lin et al. | |
| 7,183,493 B2 | 2/2007 | Garcia et al. | |
| 7,224,073 B2 | 5/2007 | Kim | |
| 7,242,099 B2 | 7/2007 | Lin et al. | |
| 7,271,484 B2 | 9/2007 | Reiss et al. | |
| 7,294,451 B2 | 11/2007 | Chiu et al. | |
| 7,294,457 B2 | 11/2007 | Kukolj et al. | |
| 7,294,929 B2 | 11/2007 | Miyazaki | |
| 7,317,245 B1 | 1/2008 | Lee et al. | |
| 7,361,990 B2 | 4/2008 | Lu et al. | |

(56) References Cited

U.S. PATENT DOCUMENTS

| | | |
|---|---|---|
| 7,405,484 B2 | 7/2008 | Usui et al. |
| 7,436,063 B2 | 10/2008 | Miyata et al. |
| 7,462,942 B2 | 12/2008 | Tan et al. |
| 7,488,896 B2 | 2/2009 | Saiki et al. |
| 7,521,284 B2 | 4/2009 | Miranda et al. |
| 7,642,660 B2 | 1/2010 | Tay et al. |
| 7,663,248 B2 | 2/2010 | Hedler et al. |
| 7,663,250 B2 | 2/2010 | Jeon et al. |
| 7,670,939 B2 | 3/2010 | Topacio et al. |
| 7,671,454 B2 | 3/2010 | Seko |
| 7,692,314 B2 | 4/2010 | Yang et al. |
| 7,700,407 B2 | 4/2010 | Pendse |
| 7,732,913 B2 | 6/2010 | Hsieh et al. |
| 7,750,457 B2 | 7/2010 | Seko |
| 7,790,509 B2 | 9/2010 | Gerber |
| 7,791,211 B2 | 9/2010 | Chen et al. |
| 7,847,399 B2 | 12/2010 | Masumoto |
| 7,847,417 B2 | 12/2010 | Araki et al. |
| 7,851,928 B2 | 12/2010 | Gallegos et al. |
| 7,898,083 B2 | 3/2011 | Castro |
| 7,902,660 B1 | 3/2011 | Lee et al. |
| 7,902,678 B2 | 3/2011 | Ohuchi et al. |
| 7,902,679 B2 | 3/2011 | Lin et al. |
| 7,932,170 B1 | 4/2011 | Huemoeller et al. |
| 7,947,602 B2 | 5/2011 | Ito et al. |
| 7,973,406 B2 | 7/2011 | Pendse |
| 8,026,128 B2 | 9/2011 | Pendse |
| 8,129,841 B2 | 3/2012 | Pendse et al. |
| 8,178,392 B2 | 5/2012 | Choi et al. |
| 8,188,598 B2 * | 5/2012 | Pendse .................. 257/734 |
| 8,318,537 B2 * | 11/2012 | Pendse .................. 438/108 |
| 8,759,972 B2 * | 6/2014 | Pendse .................. 257/737 |
| 2001/0008309 A1 | 7/2001 | Iijima et al. |
| 2001/0013423 A1 | 8/2001 | Dalal et al. |
| 2001/0018230 A1 | 8/2001 | Jimarez et al. |
| 2002/0033412 A1 | 3/2002 | Tung |
| 2002/0041036 A1 | 4/2002 | Smith |
| 2002/0070451 A1 | 6/2002 | Burnette et al. |
| 2002/0100610 A1 | 8/2002 | Yasuda et al. |
| 2002/0121706 A1 | 9/2002 | Tatsuta et al. |
| 2002/0155637 A1 | 10/2002 | Lee |
| 2002/0179689 A1 | 12/2002 | Tung |
| 2002/0192865 A1 | 12/2002 | Imasu et al. |
| 2003/0049411 A1 | 3/2003 | Chaudhuri et al. |
| 2003/0057551 A1 * | 3/2003 | Datta et al. .................. 257/737 |
| 2003/0067084 A1 | 4/2003 | Shintani |
| 2003/0116866 A1 | 6/2003 | Cher'Khng et al. |
| 2003/0127734 A1 | 7/2003 | Lee et al. |
| 2003/0127747 A1 | 7/2003 | Kajiwara et al. |
| 2003/0157792 A1 * | 8/2003 | Tong et al. .................. 438/614 |
| 2003/0168748 A1 | 9/2003 | Katagiri et al. |
| 2003/0175146 A1 | 9/2003 | Yeh et al. |
| 2004/0026107 A1 | 2/2004 | Caldwell et al. |
| 2004/0027788 A1 | 2/2004 | Chiu et al. |
| 2004/0035909 A1 | 2/2004 | Yeh et al. |
| 2004/0046263 A1 | 3/2004 | Harper et al. |
| 2004/0046264 A1 | 3/2004 | Ho et al. |
| 2004/0056341 A1 | 3/2004 | Endo et al. |
| 2004/0105223 A1 | 6/2004 | Okada et al. |
| 2004/0108135 A1 * | 6/2004 | Ashida .................. 174/260 |
| 2004/0126927 A1 | 7/2004 | Lin et al. |
| 2004/0145054 A1 * | 7/2004 | Bang et al. .................. 257/737 |
| 2004/0210122 A1 | 10/2004 | Sieburg |
| 2004/0232560 A1 | 11/2004 | Su |
| 2004/0232562 A1 | 11/2004 | Hortaleza et al. |
| 2005/0046041 A1 * | 3/2005 | Tsai .................. 257/778 |
| 2005/0082654 A1 | 4/2005 | Humpston et al. |
| 2005/0103516 A1 | 5/2005 | Kaneyuki |
| 2005/0224991 A1 * | 10/2005 | Yeo .................. 257/781 |
| 2005/0248037 A1 | 11/2005 | Hung et al. |
| 2006/0131758 A1 | 6/2006 | Dao |
| 2006/0192294 A1 | 8/2006 | Lee |
| 2006/0202331 A1 * | 9/2006 | Hu .................. 257/737 |
| 2006/0216860 A1 | 9/2006 | Pendse |
| 2006/0255473 A1 | 11/2006 | Pendse |
| 2007/0200234 A1 | 8/2007 | Gerber et al. |
| 2007/0259514 A1 | 11/2007 | Otremba |
| 2008/0088013 A1 | 4/2008 | Chew et al. |
| 2008/0093749 A1 | 4/2008 | Gerber et al. |
| 2008/0179740 A1 | 7/2008 | Liao |
| 2008/0213941 A1 | 9/2008 | Pendse |
| 2008/0277802 A1 | 11/2008 | Tsai et al. |
| 2009/0045507 A1 | 2/2009 | Pendse et al. |
| 2009/0057378 A1 | 3/2009 | Hwang et al. |
| 2009/0108445 A1 | 4/2009 | Liang |
| 2009/0114436 A1 | 5/2009 | Chen et al. |
| 2009/0146303 A1 | 6/2009 | Kwon |
| 2009/0152716 A1 | 6/2009 | Sohara |
| 2009/0191329 A1 | 7/2009 | Wang |
| 2009/0288866 A1 | 11/2009 | Tsai et al. |
| 2009/0308647 A1 | 12/2009 | Liao |
| 2010/0139965 A1 | 6/2010 | Wang et al. |
| 2011/0049703 A1 | 3/2011 | Hsu et al. |
| 2013/0214409 A1 | 8/2013 | Pagaila et al. |
| 2013/0277830 A1 | 10/2013 | Yu et al. |

FOREIGN PATENT DOCUMENTS

| | | |
|---|---|---|
| JP | 6503687 | 4/1994 |
| JP | 09-097791 | 8/1997 |
| JP | 10-256307 | 9/1998 |
| JP | 10-256315 | 9/1998 |
| JP | 11145176 | 5/1999 |
| JP | 11233571 | 8/1999 |
| JP | 11330162 | 11/1999 |
| JP | 2000-031204 | 1/2000 |
| JP | 2000-133667 | 12/2000 |
| JP | 2000-349194 | 12/2000 |
| JP | 2001156203 | 6/2001 |
| JP | 2001332583 | 11/2001 |
| JP | 2001-351945 | 12/2001 |
| JP | 2002270732 | 9/2002 |
| JP | 2004-221205 | 5/2004 |
| JP | 2004165283 | 6/2004 |
| JP | 2005109187 | 4/2005 |
| JP | 2005333166 A | 12/2005 |
| KR | 1998-79438 | 11/1998 |
| KR | 2000-62333 | 10/2000 |
| SG | 100817 | 7/2004 |
| WO | 9306964 A1 | 4/1993 |
| WO | 03071842 A1 | 8/2003 |

OTHER PUBLICATIONS

Yamada, Hiroshi et al., "A fine pitch and high aspect ratio bump array for flip-chip interconnection", Int'l Electronics Manufacturing Technology Symposium, 1992, pp. 288-292, IEEE/CHMT.

Kawahara, Toshimi, "SuperCSP", IEEE Transactions on Advanced Packaging, May 2000, pp. 215-219, vol. 23, No. 2.

Lu, H. et al., "Predicting Optimal Process Conditions for Flip-Chip Assembly Using Copper Column Bumped Dies", Electronics Packaging Technology Conference, 2002, pp. 338-343.

Appelt et al., "Fine Pitch Flip Chip Chip Scale Packaging", pp. 1-4, no date available.

Chen et al., "Advanced Flip-Chip Package Production Solution for 40nm/28nm Technology Nodes", International Electron Devices Meeting, pp. 768-771, IEEE 2010.

Gerber et al., "Next Generation Fine Pitch Cu Pillar Technology—Enabling Next Generation Silicon Nodes", Electronic Components and Technology Conference, pp. 612-618, 2011.

He et al., "All-Copper Chip-to-Substrate Interconnects Part II. Modeling and Design", Journal of the Electrochemical Society, 155(4):D314-D322, 2008.

Heinen, K. Gail et al., "Multichip Assembly with Flipped Integrated Circuits", IEEE Transactions on Components, Hybrids, and Manufactureing Technology, vol. 12 No. 4, 1989, pp. 650-657.

Lau, John H. et al., "A New Thermal-Fatigue Life Prediction Model For Wafer Level Chip Scale Package (WLCSP) Solder Joints", Journal of Electronic Packaging, vol. 124, 2002, pp. 212-220.

(56) References Cited

OTHER PUBLICATIONS

Love, David et al., "Wire Interconnect Technology, A New High-Reliability Tight-Pitch Interconnect Technology", Karl Suss, 1999.
Pendse et al., "Bon-on-Lead: A Novel Flip Chip Interconnection Technology for Fine Effective Pitch and High I/O Density", Electronic Components and Technology Conference, pp. 16-23, 2006.
Powell, D. O. et al., 'Flip-Chip on FR-4 Integrated Circuit Packaging, HBN Technology Products, 1993, pp. 182-186.
Schubert, A. et al.. "Numerical and Experimental Investigations of Large IC Flip Chip Attach", Electronic Components and Technology Conference, 2000, pp. 1338-1346.
Son, Ho Young et al., "Studies on the Thermal Cycling Reliability of Fine Pitch Cu/SnAg Double-Bump Flip Chip Assemblies on Organic Substrates: Experimental Results and Numerical Analysis", Electronic Components and Technology Conference, 2008, pp. 2035-2043.

* cited by examiner

  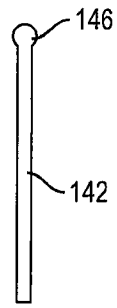 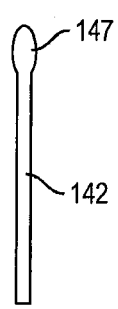 
FIG. 14A  FIG. 14B  FIG. 14C  FIG. 14D  FIG. 14E
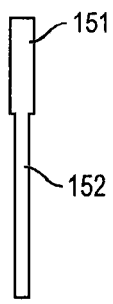 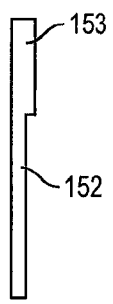 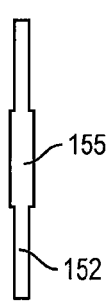
FIG. 15A  FIG. 15B  FIG. 15C
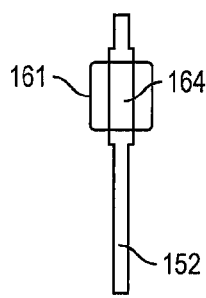 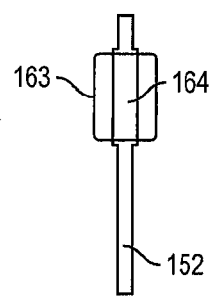
FIG. 16A  FIG. 16B

FLIP CHIP INTERCONNECTION HAVING NARROW INTERCONNECTION SITES ON THE SUBSTRATE

CLAIM OF DOMESTIC PRIORITY

The present application is a continuation of U.S. patent application Ser. No. 12/757,889, now U.S. Pat. No. 8,318,537, filed Apr. 9, 2010, which is a continuation of U.S. patent application Ser. No. 11/388,755, filed Mar. 24, 2006, now abandoned, which claims the benefit of U.S. Provisional Application No. 60/665,208, filed Mar. 25, 2005, which applications are incorporated herein by reference.

CROSS-REFERENCE TO RELATED APPLICATIONS

This application is related to U.S. application Ser. No. 10/985,654, now U.S. Pat. No. 7,368,817, filed Nov. 10, 2004, titled "Bump-on-lead flip chip interconnection".

FIELD OF THE INVENTION

This invention relates to semiconductor packaging and, particularly, to flip chip interconnection.

BACKGROUND OF THE INVENTION

Flip chip packages include a semiconductor die mounted onto a package substrate with the active side of the die facing the substrate. The substrate is made up of a dielectric layer and at least one metal layer, patterned to provide substrate circuitry, which includes among other features traces ("leads") leading to interconnect pads. The metal layer may be patterned by, for example, a mask-and etch process. Conventionally, interconnection of the circuitry in the die with circuitry in the substrate is made by way of bumps which are attached to an array of interconnect pads on the die, and bonded to a corresponding (complementary) array of interconnect pads (often referred to as "capture pads") on the substrate. The capture pads are typically much wider than the leads, and can be as wide as, for example, about 2 to 4 times the nominal or design width of the leads.

The areal density of electronic features on integrated circuits has increased enormously, and chips having a greater density of circuit features also may have a greater density of sites ("die pads") for interconnection with the circuitry on a package substrate.

The package is connected to underlying circuitry, such as a printed circuit board (e.g., a "motherboard"), in the device in which the package is employed, by way of second level interconnects (e.g., pins, secondary interconnect solder balls) between the package and the underlying circuit. The second level interconnects have a greater pitch than the flip chip interconnects, and so the routing on the substrate conventionally "fans out". Significant technological advances in patterning the metal layer on the substrate have enabled construction of fine lines and spaces; but in the conventional arrangement space between adjacent pads limits the number of traces than can escape from the more inward capture pads in the array, and the fan out routing between the capture pads beneath the die and the external pins of the package is conventionally formed on multiple metal layers within the package substrate. For a complex interconnect array, substrates having multiple layers may be required to achieve routing between the die pads and the second level interconnects on the package.

Multiple layer substrates are expensive, and in conventional flip chip constructs the substrate alone typically accounts for more than half the package cost (about 60% in some typical instances). The high cost of multilayer substrates has been a factor in limiting proliferation of flip chip technology in mainstream products.

In conventional flip chip constructs the escape routing pattern typically introduces additional electrical parasitics, because the routing includes short runs of unshielded wiring and vias between wiring layers in the signal transmission path. Electrical parasitics can significantly limit package performance.

SUMMARY OF THE INVENTION

According to the invention flip chip interconnect is accomplished by connecting the interconnect bump directly onto a narrow interconnection pad, or narrow pad, rather than onto a conventional capture pad. The width of the narrow pad according to the invention is selected according to the base diameter of the interconnect bump that is to be connected onto the narrow pad. Particularly, the width of the narrow pad is less (such as in a range about 20% to about 80%) than the base diameter of the interconnect bump. The invention provides more efficient routing of traces on the substrate. Particularly, the signal routing can be formed entirely in a single metal layer of the substrate. This reduces the number of layers in the substrate, and forming the signal traces in a single layer also permits relaxation of some of the via, line and space design rules that the substrate must meet. This simplification of the substrate greatly reduces the overall cost of the flip chip package. The bump-on-narrow-pad architecture also helps eliminate such features as vias and "stubs" from the substrate design, and enables a microstrip controlled impedance electrical environment for signal transmission, thereby greatly improving performance.

In one general aspect the invention features a flip chip interconnection having solder bumps attached to interconnect pads on a die and mated onto corresponding narrow interconnection pads on a substrate.

In another general aspect the invention features a flip chip package including a die having solder bumps attached to interconnect pads in an active surface, and a substrate having narrow interconnection pads in a die attach surface, in which the bumps are mated onto the narrow pads.

In some embodiments the bump-on-narrow-pad interconnection is formed according to methods of the invention without use of a solder mask to confine the molten solder during a re-melt stage in the process. Avoiding the need for a solder mask allows for finer interconnection geometry.

In some embodiments the substrate is further provided with a solder mask having openings over the narrow interconnection pads. In some embodiments the substrate is further provided with solder paste on the narrow interconnection pads.

In another general aspect the invention features a method for forming flip chip interconnection, by providing a substrate having narrow interconnection pads formed in a die attach surface and a die having bumps attached to interconnect pads in an active surface; supporting the substrate and the die; dispensing a quantity of a curable adhesive on the substrate (covering at least the narrow interconnection pads) or on the active side of the die (covering at least the bumps); positioning the die with the active side of the die toward the die attach surface of the substrate, and aligning the die and substrate and moving one toward the other so that the bumps contact the corresponding narrow interconnection pads on the substrate;

applying a force to press the bumps onto the mating narrow pads, sufficient to displace the adhesive from between the bump and the mating narrow pad; at least partially curing the adhesive; melting and then re-solidifying the solder, forming a metallurgical interconnection between the bump and the narrow pad.

In another general aspect the invention features a method for forming flip chip interconnection, by providing a substrate having narrow interconnection pads formed in a die attach surface and having a solder mask having openings over the narrow pads, and a die having bumps attached to interconnect pads in an active surface; supporting the substrate and the die; positioning the die with the active side of the die toward the die attach surface of the substrate, and aligning the die and substrate and moving one toward the other so that the bumps contact the corresponding narrow pads on the substrate; melting and then re-solidifying to form the interconnection between the bump and the narrow pad.

In some embodiments the solder bump includes a collapsible solder portion, and the melt and solidifying step melts the bump to form the interconnection on the narrow pad. In some embodiments the substrate is provided with a solder paste on the narrow pads, and the step of moving the die and the substrate toward one another effects a contact between the bumps and the solder on the narrow pads, and the melt and solidifying step melts the solder on the narrow pad to form the interconnection.

In another general aspect the invention features a method for forming flip chip interconnection, by providing a substrate having narrow interconnection pads formed in a die attach surface and having a solder mask having openings over the narrow pads and having solder paste on the narrow pads, and a die having bumps attached to interconnect pads in an active surface; supporting the substrate and the die; positioning the die with the active side of the die toward the die attach surface of the substrate, and aligning the die and substrate and moving one toward the other so that the bumps contact the solder paste on the corresponding narrow pads on the substrate; melting and then re-solidifying the solder paste, forming a metallurgical interconnection between the bump and the narrow pad.

In one embodiment, the invention is a method of making a semiconductor device comprising the steps of forming a first conductive layer over a semiconductor die, forming a second conductive layer over a substrate, and forming an interconnect structure between the first conductive layer and an interconnect site on the second conductive layer. A width of the interconnect site is greater than 20% and less than 80% of a width of a contact interface between the interconnect structure and first conductive layer.

In another embodiment, the invention is a method of making a semiconductor device comprising the steps of forming a first conductive layer over a semiconductor die, forming a second conductive layer over a substrate, and forming a composite bump including a non-fusible portion and fusible portion between the first conductive layer and an interconnect site on the second conductive layer. A width of the interconnect site is less than a width of the first conductive layer.

In another embodiment, the invention is a method of making a semiconductor device comprising the steps of forming a first conductive layer over a semiconductor die, forming a second conductive layer over a substrate, and forming an interconnect structure between the first conductive layer and an interconnect site on the second conductive layer. A width of the interconnect site is less than a width of the first conductive layer and a length of the interconnect site is equal to or greater than a width of a contact interface between the interconnect structure and first conductive layer.

In another embodiment, the invention is a semiconductor device comprising a semiconductor die including a first conductive layer formed over the semiconductor die. A substrate includes a second conductive layer formed over the substrate. A composite bump includes a non-fusible portion and fusible portion formed between the first conductive layer and an interconnect site on the second conductive layer. A width of the interconnect site is less than a width of the first conductive layer.

BRIEF DESCRIPTION OF THE DRAWINGS

FIGS. 14A-14E are diagrammatic sketches in plan view illustrating various interconnect pad shapes according to embodiments of the invention;

FIGS. 15A-15C are diagrammatic sketches in plan view illustrating various interconnect pad configurations according to embodiments of the invention;

FIGS. 16A and 16B are diagrammatic sketches in plan view illustrating solder mask openings according to embodiments of the invention;

DETAILED DESCRIPTION OF THE DRAWINGS

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs.

The conventional flip chip interconnection is made by using a melting process to join the bumps (conventionally, solder bumps) onto the mating surfaces of the corresponding capture pads and, accordingly, this is known as a "bump-on-capture pad" ("BOC") interconnect. Two features are evident in the BOC design: first, a comparatively large capture pad is required to mate with the bump on the die; second, an insulating material, typically known as a "solder mask" is required to confine the flow of solder during the interconnection process. The solder mask opening may define the contour of the melted solder at the capture pad ("solder mask defined"), or the solder contour may not be defined by the mask opening ("non-solder mask defined"); in the latter case—as in the example of FIG. 1, described in more detail below—the solder mask opening may be significantly larger than the capture pad. The techniques for defining solder mask openings have wide tolerance ranges. Consequently, for a solder mask defined bump configuration, the capture pad must be large (typically considerably larger than the design size for the mask opening, to ensure that the mask opening will be located on the mating surface of the pad; and for a non-solder mask defined bump configuration, the solder mask opening must be larger than the capture pad. The width of capture pads (or diameter, for circular pads) is typically about the same as the ball (or bump) diameter, and can be as much as two to four times wider than the trace width. This results in considerable loss of routing space on the top substrate layer. In particular, for example, the "escape routing pitch" is much bigger than the finest trace pitch that the substrate technology can offer. This means that a significant number of pads must be routed on lower substrate layers by means of short stubs and vias, often beneath the footprint of the die, emanating from the pads in question.

Figure 1:
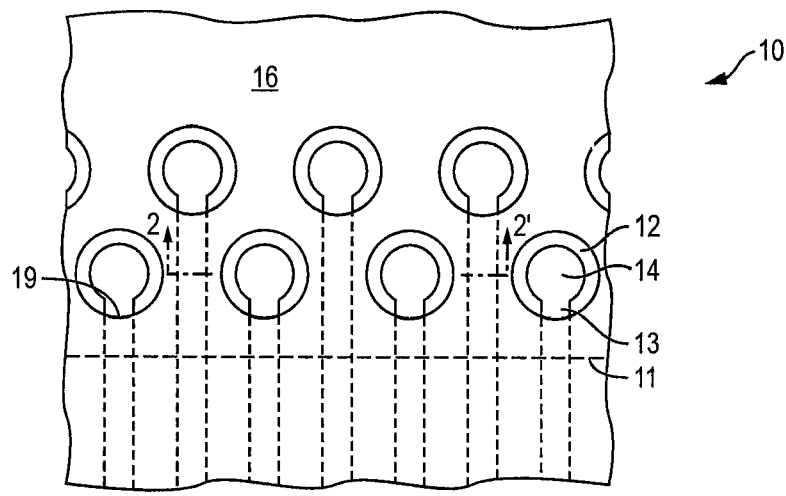
FIG. 1 is a diagrammatic sketch of a portion of a conventional bump-on-capture pad flip chip interconnection, in a sectional view parallel to the plane of the package substrate surface, as indicated by the arrows 1-1' in FIG. 2.
Figure 2:
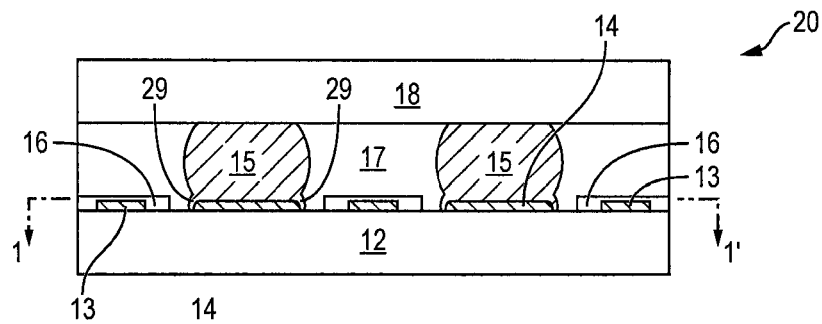
FIG. 2 is a diagrammatic sketch showing a portion of a conventional bump-on-capture pad flip chip interconnection, in a sectional view perpendicular to the plane of the package substrate surface, as indicated by the arrows 2-2' in FIG. 1.

FIGS. 1 and 2 show portions 10, 20 of a conventional flip chip package, in diagrammatic sectional views; the partial sectional view in FIG. 1 is taken in a plane parallel to the package substrate surface, along the line 1-1' in FIG. 2; and the partial sectional view in FIG. 2 is taken in a plane perpendicular to the package substrate surface, along the line 2-2' in FIG. 1. Certain features are shown as if transparent, but many of the features in FIG. 1 are shown at least partly obscured by overlying features. Referring now to both FIG. 1 and FIG. 2, a die attach surface of the package substrate includes a metal layer formed on a dielectric layer 12. The metal layer is patterned to form leads 13 and capture pads 14. An insulating layer 16, typically termed a "solder mask", covers the die attach surface of the substrate; the solder mask is usually constructed of a photodefinable material, and is patterned by conventional photoresist patterning techniques to leave the mating surfaces of the capture pads 14 exposed. Interconnect bumps 15 attached to pads on the active side of the die 18 are joined to the mating surfaces of corresponding capture pads 14 on the substrate to form appropriate electrical interconnection between the circuitry on the die and the leads on the substrate. After the reflowed solder is cooled to establish the electrical connection, an underfill material 17 is introduced into the space between the die 18 and the substrate 12, mechanically stabilizing the interconnects and protecting the features between the die and the substrate.

As FIG. 1 shows by way of example, signal escape traces in the upper metal layer of the substrate (leads 13), lead from their respective capture pads 14 across the die edge location, indicated by the broken line 11, and away from the die footprint. In a typical example the signal traces may have an escape pitch $P_E$ about 112 um. A 30 um/30 um design rule is typical for the traces themselves in a configuration as shown in FIG. 1; that is, the traces are nominally 30 um wide, and they can be spaced as close together as 30 um. The capture pads are typically three times greater than the trace width and, accordingly in this example the capture pads have a width (or diameter, as they are roughly circular in this example) nominally 90 um. And, in this example, the openings in the solder mask are larger than the pads, having a nominal width (diameter) of 135 um.

FIGS. 1 and 2 show a non-solder mask defined solder contour. As the fusible material of the bumps on the die melt, the molten solder tends to "wet" the metal of the leads and capture pads, and the solder tends to "run out" over any contiguous metal surfaces that are not masked. The solder tends to flow along the contiguous lead 13, and here the solder flow is limited by the solder mask, for example at 19 in FIG. 1. A non-solder mask defined solder contour at the pad is apparent in FIG. 2, in which the material of the bumps 15 is shown as having flowed, 29, over the sides of the capture pads 14 and down to the surface of the dielectric layer of the substrate 12. This is referred to as a non-solder mask defined contour because the solder mask does not limit the flow of solder over the surface and down over the sides of the capture pads, and—unless there is a substantial excess of solder at the pad—the flow of solder is limited by the fact that the dielectric surface of the substrate is typically not wettable by the molten solder. A lower limit on the density of the capture pads in a conventional arrangement, as in FIG. 1, is determined by, among other factors, limits on the capacity of the mask forming technology to make reliable narrow mask structures, and the need to provide mask structures between adjacent mask openings. A lower limit on the escape density is additionally determined by, among other factors, the need for escape lines from more centrally located capture pads to be routed between more peripherally located capture pads.

Figure 3:
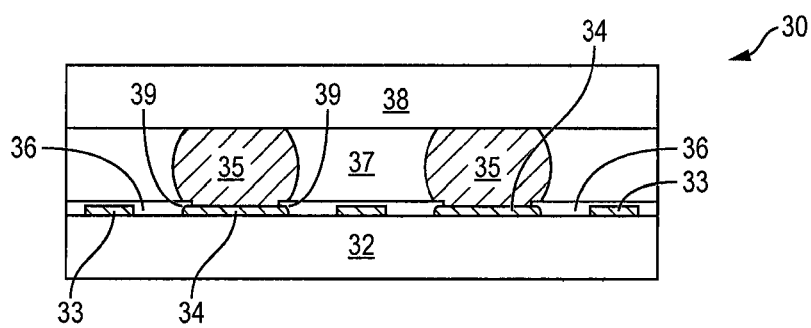
FIG. 3 is a diagrammatic sketch showing a portion of another conventional bump-on-capture pad flip chip interconnection, in a sectional view perpendicular to the plane of the package substrate surface.

FIG. 3 shows a conventional solder mask defined solder contour, in a sectional view similar to that in FIG. 2. A die 38 is shown affixed by way of bumps 35 onto the mating surfaces of capture pads 34 formed along with traces (leads 33) by patterning a metal layer on the die attach side of a dielectric layer of the substrate 32. After the reflowed solder is cooled to establish the electrical connection, an underfill material 37 is introduced into the space between the die 38 and the substrate 32, mechanically stabilizing the interconnects and protecting the features between the die and the substrate. Here the capture pads 34 are wider than in the example of FIGS. 1 and 2, and the solder mask openings are smaller than the capture pads, so that the solder mask material covers the sides and part of the mating surface of each capture pad, as shown at 39, as well as the leads 33. When the bumps 35 are brought into contact with the mating surfaces of the respective capture pads 34, and then melted, the solder mask material 39 restricts the flow of the molten solder, so that the shapes of the solder contours are defined by the shapes and dimensions of the mask openings over the capture pads 34. In a typical example of a conventional solder mask defined bump-on-capture pad interconnection, the capture pad has a diameter about 140 um, and the solder mask opening has a diameter about 90 um, and the routing traces are about 25-30 um wide. The diameter of the mating surface for attachment of the bump to the die pad (not shown in FIG. 2 or 3), that is, the place of interface between the bump and the die pad, is defined by the solder mask opening as having a diameter about 90 um, in this example.

Figure 4:
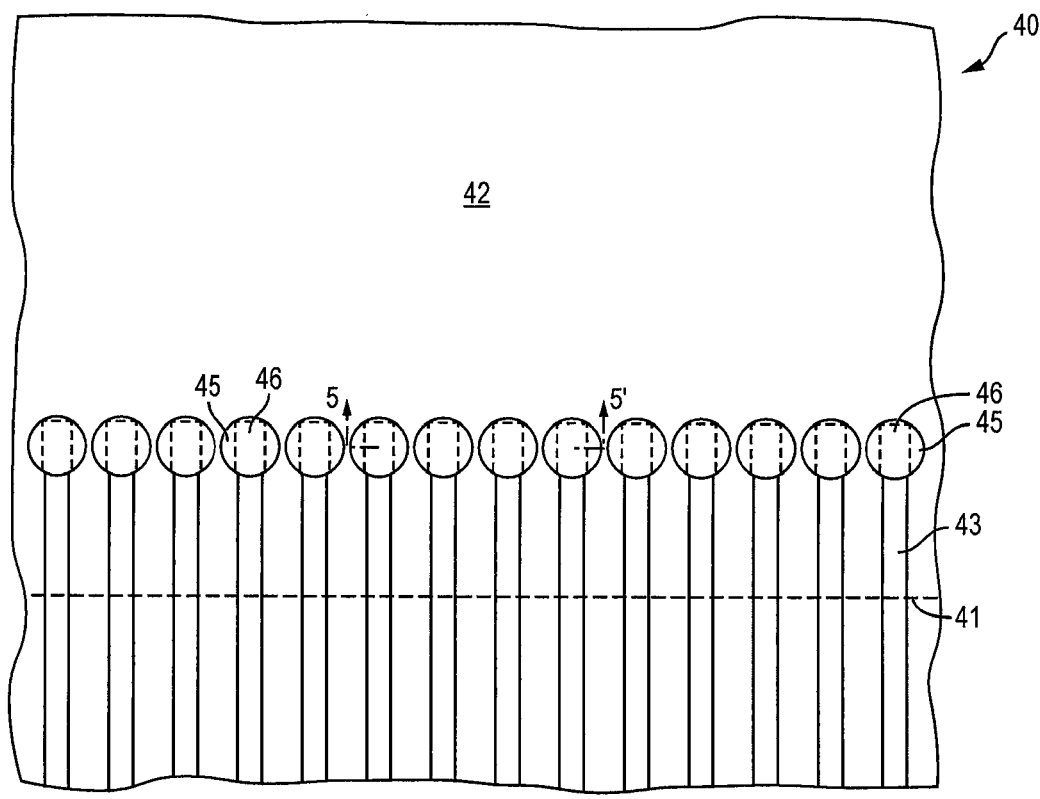
FIG. 4 is a diagrammatic sketch of a portion of an embodiment of a bump-on-narrow-pad flip chip interconnection according to an embodiment of the invention, in a sectional view parallel to the plane of the package substrate surface.
Figure 5:
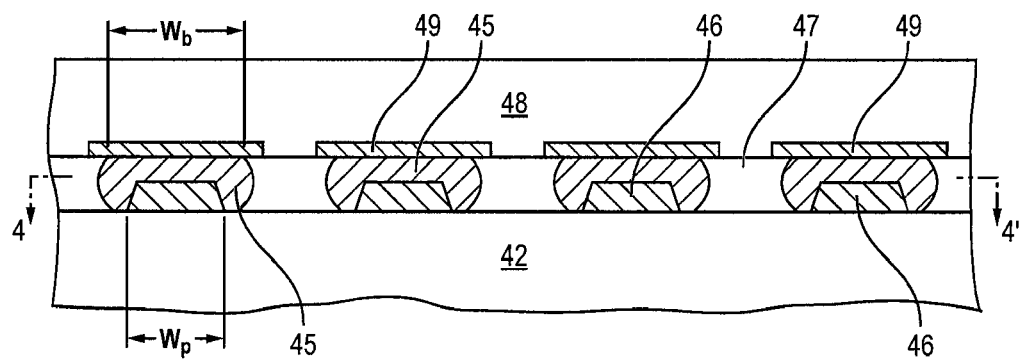
FIG. 5 is a diagrammatic sketch showing a portion of an embodiment of a bump-on-narrow-pad flip chip interconnection according to an embodiment of the invention as in FIG. 4, in a sectional view perpendicular to the plane of the package substrate surface, as indicated by the arrows 5-5' in FIG. 4.
Figure 6:
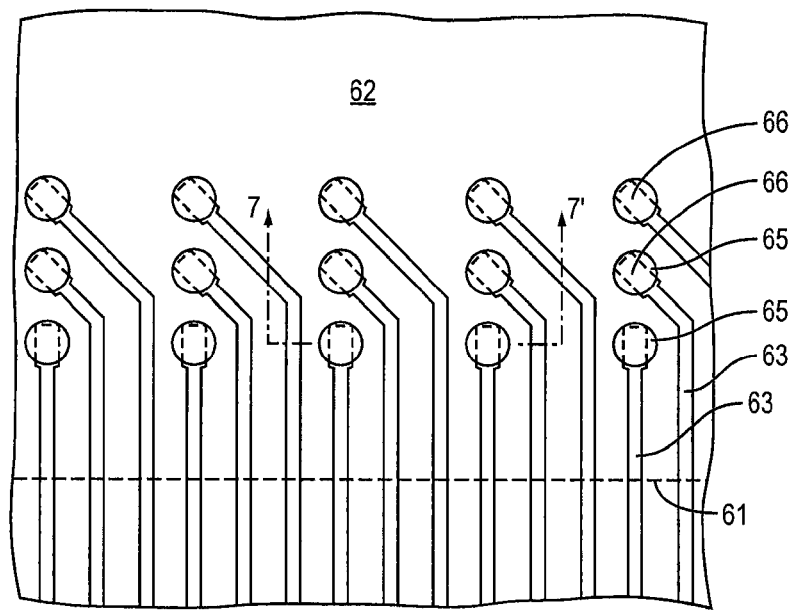
FIG. 6 is a diagrammatic sketch of a portion of another embodiment of a bump-on-narrow-pad flip chip interconnection according to an embodiment of the invention, in a sectional view parallel to the plane of the package substrate surface.
Figure 7:
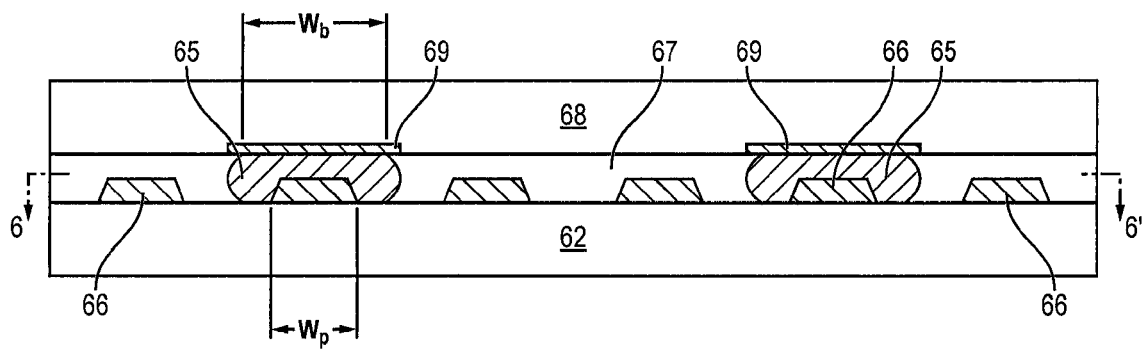
FIG. 7 is a diagrammatic sketch showing a portion of an embodiment of a bump-on-narrow-pad flip chip interconnection according to an embodiment of the invention as in FIG. 6, in a sectional view perpendicular to the plane of the package substrate surface, as indicated by the arrows 7-7' in FIG. 6.

FIGS. 4 and 6 each show a portion of a bump-on-narrow-pad ("BONP") flip chip interconnection according to an embodiment of the invention, in a diagrammatic partial sectional view taken in a plane parallel to the substrate surface, along the lines 4-4' and 6-6' in FIGS. 5 and 7, respectively. Certain features are shown as if transparent. According to the invention the interconnection is achieved by mating the bumps onto respective narrow interconnection pads on the substrate and, accordingly, this is referred to herein as a "bump-on-narrow-pad" ("BONP") interconnect. Solder mask materials typically cannot be resolved at such fine geometries and, according to these embodiments of the invention, no solder mask is used. Instead the function of confining molten solder flow is accomplished without a solder mask in the course of the assembly process (as described below). FIG. 5 shows a partial sectional view of a package as in FIG. 4, taken in a plane perpendicular to the plane of the package substrate surface, along the line 5-5' in FIG. 4; and FIG. 7 shows a partial sectional view of a package as in FIG. 6, taken in a plane perpendicular to the plane of the package substrate surface, along the line 7-7' in FIG. 6.

Escape routing patterns for bump-on-narrow-pad ("BONP") substrates according to the invention are shown by way of example in FIGS. 4 and 6: in FIG. 4, arranged for a die on which the die attach pads for the interconnect balls are in a row near the die perimeter, the bumps 45 are mated onto corresponding narrow interconnection pads on the escape traces 43 in a row near the edge of the die footprint, indicated by the broken line 41; in FIG. 6, arranged for a die on which the die attach pads are in an array of parallel rows near the die perimeter, the bumps 65 are mated onto corresponding narrow interconnection pads on the escape traces 63 in a complementary array near the edge of the die footprint, indicated by the broken line 61.

As FIGS. 4 and 6 illustrate, the routing density achievable using bump-on-narrow-pad interconnect according to the invention can equal the finest trace pitch offered by the substrate technology. In the specific case illustrated, this constitutes a routing density which is approximately 90% higher than is achieved in a conventional bump-on-capture pad arrangement. In the perimeter row embodiments of BONP (e.g., FIG. 4), the bumps are placed at a fine pitch, which can equal the finest trace pitch of the substrate. This arrangement poses a challenge for the assembly process, because the bumping and bonding pitch must be very fine. In the perimeter array version of BONP (e.g., FIG. 6), the bumps are arranged on an area array, providing greater space for a larger bumping and bonding pitch, and relieving the technological challenges for the assembly process. Even in the array embodiments, the routing traces on the substrate are at the same effective pitch as in the perimeter row arrangement, and an arrangement as in FIG. 6 relieves the burden of fine pitch bumping and bonding without sacrificing the fine escape routing pitch advantage.

Referring particularly now to FIGS. 4 and 5, leads 43 and narrow interconnection pads 46 are formed by patterning a metal layer on a die attach surface of a substrate dielectric layer 42. The narrow pads 46 are formed as a widening of the traces 43 at the interconnection sites. The "width" of an interconnection pad ($W_p$ in FIG. 5) is the nominal or design dimension across the widened part of the trace at the interconnection site. According to the invention, the width of the narrow interconnection pad on a substrate is established according to the bump base width ("base diameter") of the bumps on the die that is to be connected to the substrate. The "bump base width" ($W_b$ in FIG. 5) is the nominal or design diameter of the generally round (approximately circular) contact interface between the bump 45 and the die pad 49. (As may be appreciated, the diameter of the bump, taken in a plane parallel to the bump-pad interface, may be greater than the bump base width, as illustrated diagrammatically in FIGS. 2, 3, 5 and 7, for example.) Particularly according to the invention, the interconnection pad width $W_p$ is smaller than the bump base width $W_b$, and the narrow interconnection pad width may be as small as 20% of the bump base width. In many embodiments the narrow pad width is in a range about 20% to about 80% of the bump base width. In some embodiments the narrow interconnection pad width is less than the bump base width and greater than about 25% of the bump base width. In some embodiments the narrow pad width is less than about 60% of the bump base width.

According to the invention, electrical interconnection of the die 48 is made by joining the bumps 45 on the die onto the narrow interconnection pads 46 on the leads 43. The conventional comparatively wide capture pad is unnecessary according to the invention and, in embodiments as in FIGS. 4 and 5, no solder mask is required; the process is described in detail below.

Conventional capture pads typically are about the same width (diameter) as the bumps, and are typically two to four times as wide as the trace or lead width. As will be appreciated, some variation in the width of leads is expected. As used herein, a narrow interconnection pad has a nominal or design width at least about 120% of the nominal or trace design rule width, and bump-on-narrow-lead interconnection according to the invention includes bumps connected to widened parts of traces that are greater than about 120% of the nominal or trace design rule width, and less than the bump base diameter. An interconnection site that has a width less than about 120% does not constitute a narrow interconnect pad, and interconnection made by connecting bumps onto portions of leads that are less than about 120% of the nominal or trace design rule width is referred to as a "bump-on-lead" interconnection.

Similarly, referring to FIGS. 6 and 7, leads 63 and narrow interconnection pads 66 are formed by patterning a metal layer on a die attach surface of a substrate dielectric layer 62. The signal escape traces lead across the die edge location, indicated by the broken line 61, and away from the die footprint. The narrow pads 66 are formed as a widening of the traces 63 at the interconnection sites. The "width" of an interconnection pad ($W_p$ in FIG. 7) is the nominal or design dimension across the widened part of the trace at the interconnection site. In this example, as in the example shown in FIGS. 4 and 5, according to the invention, the width of the narrow interconnection pad on a substrate is established according to the bump base width of the bumps on the die that is to be connected to the substrate. The "bump base width" ($W_b$ in FIG. 7) is the nominal or design diameter of the generally round (approximately circular) contact interface between the bump 65 and the die pad 69. Particularly according to the invention, the interconnection pad width $W_p$ is smaller than the bump base width $W_b$, and the narrow interconnection pad width may be as small as 20% of the bump base width. In many embodiments the narrow pad width is in a range about 20% to about 80% of the bump base width. In some embodiments the narrow interconnection pad width is less than the bump base width and greater than about 25% of the bump base width. In some embodiments the narrow pad width is less than about 60% of the bump base width.

According to the invention, electrical interconnection of the die 68 is made by joining the bumps 65 on the die narrow interconnection pads 66 on the leads 63. Certain of the escape traces, e.g., 66, leading across the die edge location from interconnect sites in rows toward the interior of the die footprint, pass between the bumps 65 on more peripheral rows of interconnect sites. No capture pads are required according to the invention and, in embodiments as in FIGS. 6 and 7, no solder mask is required; the process is described in detail below.

According to the invention, as the techniques for forming the traces improves, it is possible to reliably form traces having nominal or design rule widths less than about 25 um. The reduced trace widths can provide for increased routing density. However, the mechanical reliability of a "bump-on-lead" flip chip interconnect on leads less than about 25 um may be unsatisfactory, because the dimensions of the interface between the bump and the lead are small, and may not provide sufficient bonding strength to provide a good electrical interconnection. The invention provides for reliable mechanical connection (and good electrical interconnection) by forming a narrow interconnect pad by widening the lead to an extent dimensionally related to the bump base diameter, and limited to less than the bump base diameter.

The narrow interconnect pad according to the invention may be shaped in any of a variety of ways. Some such shapes may be more readily manufacturable, and some may provide other process advantages. For example, the narrow pad may be generally rectangular, either square or elongated, as shown for example in FIGS. 14A and 14B; or, it may be generally round, either circular or elliptical, as shown for example in FIGS. 14C and 14D. Other shapes may be employed; one particularly useful shape is shown by way of example in FIG. 14E, having semicircular portions separated lengthwise the lead or trace by a square or rectangular portion. Also, the narrow pad can be formed as a symmetrical or an asymmetrical widening in the lead or trace, as shown in FIGS. 15A and 15B (showing a generally rectangular pad as an example). Also, the narrow pad need not be situated at, or near, the end of the lead or trace, but may be formed at any point where interconnection is specified, as illustrated in FIG. 15C (showing a generally rectangular pad as an example). Forming the pad longer than wide increases the wettable mating surface of the narrow pad (planar surface plus the exposed parts of the sides), and can improve the mechanical strength of the interconnection. Also, where the pad is longer than wide, the tolerance for misalignment of solder mask openings (or bump) is increased; particularly where the pad is at the end of the trace, an elongated pad can reduce the likelihood that a solder mask opening (or bump) will be situated off the end of the pad.

The solder mask openings shown by way of example in FIGS. 4, 6, 8 and 9 are generally round (circular or elliptical), but according to the invention the solder mask opening may be shaped in any of a variety of ways. It may be useful for example, to provide a generally rectangular solder mask opening, either square or elongated, as shown in FIGS. 16A, 16B, (showing a generally rectangular pad as an example). A square or rectangle of a given width has a greater area than a circle or ellipse having the same width (diameter, short axis). For this reason a square or rectangular mask opening has a capacity to hold a greater quantity of solder paste (or other fusible material), and accordingly this may provide an advantage where a fusible material such as a solder paste is to be applied to the mating surfaces on the narrow pads prior to mating with the bumps (described in more detail below). Also, it may be easier to print a fusible material into a square or rectangular mask opening than into a circular or elliptical mask opening, because there is greater tolerance for misalignment in the printing process. Also, given a width limitation for the mask opening, a square or rectangular mask opening provides a greater open area for mounting a large bump on the pad during the interconnection process.

Figure 17:
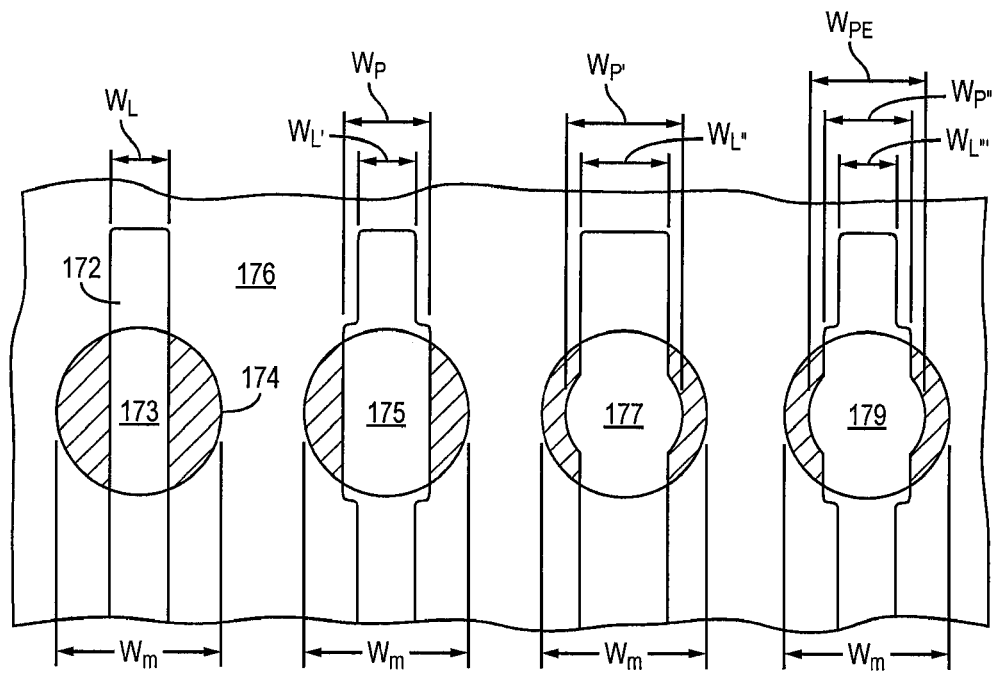
FIG. 17 is a diagrammatic sketch in plan view illustrating details of various interconnect pad configurations in relation to a solder mask opening according to embodiments of the invention.

Various narrow pad configurations according to embodiments of the invention are shown in FIG. 17 by way of example in relation to a circular mask opening 174 in a solder mask 176. The mask opening in each example has a width (diameter) Wm, which may be, for example, about 90 um. A bump-on-lead configuration is shown at 173. The lead or trace 172 has a nominal (design) width WL, which may be, for example, about 30 um. A narrow pad having a rectangular shape is shown at 175. In this example the lead or trace at which the narrow pad is formed has a nominal (design) width WL', which may be, for example, about 30 um. The rectangular narrow pad has a width WP', which may be, for example, about 45 um. A narrow pad having an oval shape is shown at 177 formed at a wider lead or trace, having a nominal (design) width WL", which may be, for example, about 50 um. A narrow pad having a rectangular shape expanded with an oval shape is shown at 179. In this example the narrower lead or trace at which the narrow pad is formed has a nominal (design) width WL'", which may be, for example, about 30 um. The rectangular portion of the narrow pad 179 has a width WP", which may be, for example, about 45 um; and the oval expanded portion has a width WPE, which may be for example, about 50 um.

Figure 18:
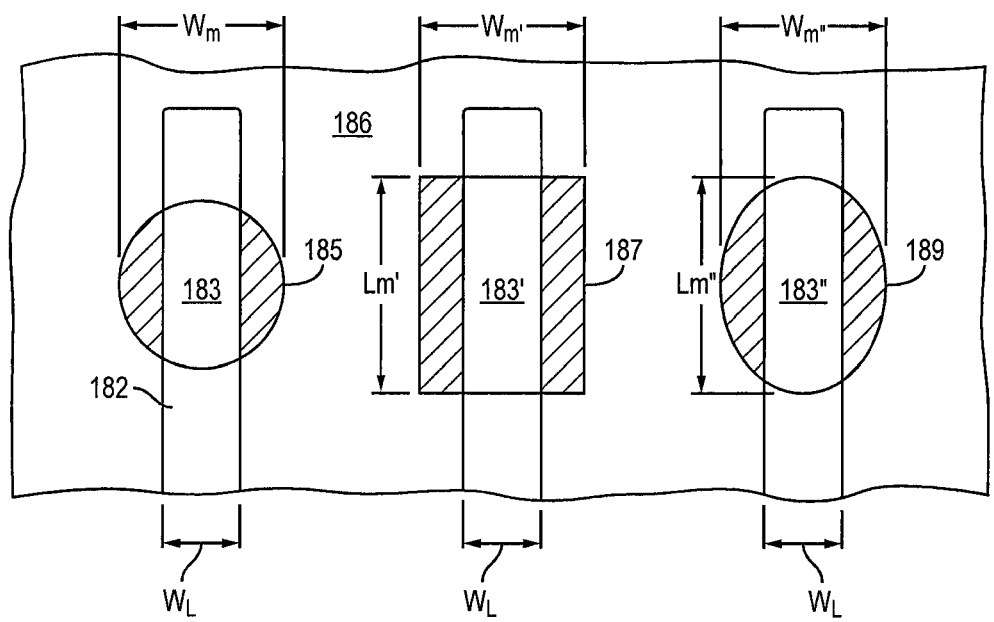
FIG. 18 is a diagrammatic sketch in plan view illustrating details of various solder mask configurations in relation to an interconnect pad according to embodiments of the invention.

Various solder mask opening configurations according to embodiments of the invention are shown in FIG. 18 by way of example in relation to a lead (or trace) or narrow pad 182. In these examples the lead or narrow pad at the interconnect site has a width WL, which may be, for example, about 40 um. In a first example, a circular solder mask opening 185 having a width (diameter) Wm, which may be, for example, about 90 um, exposes an interconnect site portion 183. In a second example a rectangular solder mask opening 187 having a width (across the lead or narrow pad) Wm', which may be, for example, about 80 um, and a length Lm', which may be, for example, about 120 um, exposes an interconnect site portion 183'. In a third example an elliptical solder mask opening 189 having a width (across the lead or narrow pad) Wm", which may be, for example, about 80 um, and a length Lm", which may be, for example, about 120 um. exposes an interconnect site portion 183". Both the rectangular opening 187 and the oval opening 189 expose a greater length (hence, area) of the lead or pad at the site 183", 183" than does the circular solder mask opening 185, even though the circular opening in this example has a greater diameter. This provides a greater area for solder reflow during the interconnect process, and can result in a more robust interconnection. The area exposed by the rectangular opening 187 is slightly greater than that provided by the elliptical opening 189 having the same width and length; and moreover, the area would be reduced if there were a slight misalignment of the elliptical opening, but not by a slight misalignment of the rectangular opening. As a practical matter, however, a design rectangular opening may have more or less rounded corners because of resolution limitations in processes for patterning openings in the solder mask dielectric.

In some illustrative examples according to the invention, the diameter of the bump base on the die to be mounted may be about 90 um, and the narrow interconnect pad is formed on the substrate to a width in a range about 25 um (where the trace width is less than about 25 um) to about 50 um. This provides a significant improvement in routing density, as compared with a substrate having a conventional capture pad having a much larger diameter, which may be typically two to four times as great as the trace width.

As FIGS. 4 and 6 illustrate, bump-on-narrow-pad interconnect according to the invention can provide a significantly higher signal trace escape routing density. Also, as FIGS. 4 and 6 illustrate, the BONP interconnect according to this aspect of the invention does not require use of a solder mask to define the solder contour at the interconnect site.

The BONP interconnection structure of embodiments such as are shown by way of example in FIGS. 4, 5, 6 and 7 can be produced according to the invention by any of several methods, not requiring a solder mask. In general, interconnect bumps (typically solder bumps) are affixed onto interconnect pads on the active side of the die. A die attach surface of the substrate (termed the "upper" surface) has an upper metal layer patterned to provide the traces and narrow pads at interconnect sites as appropriate for interconnection with the arrangement of bumps on the particular die. In a preferred method of the invention, an encapsulating resin adhesive is employed to confine the solder flow during a melt phase of the interconnection process.

Figure 8:
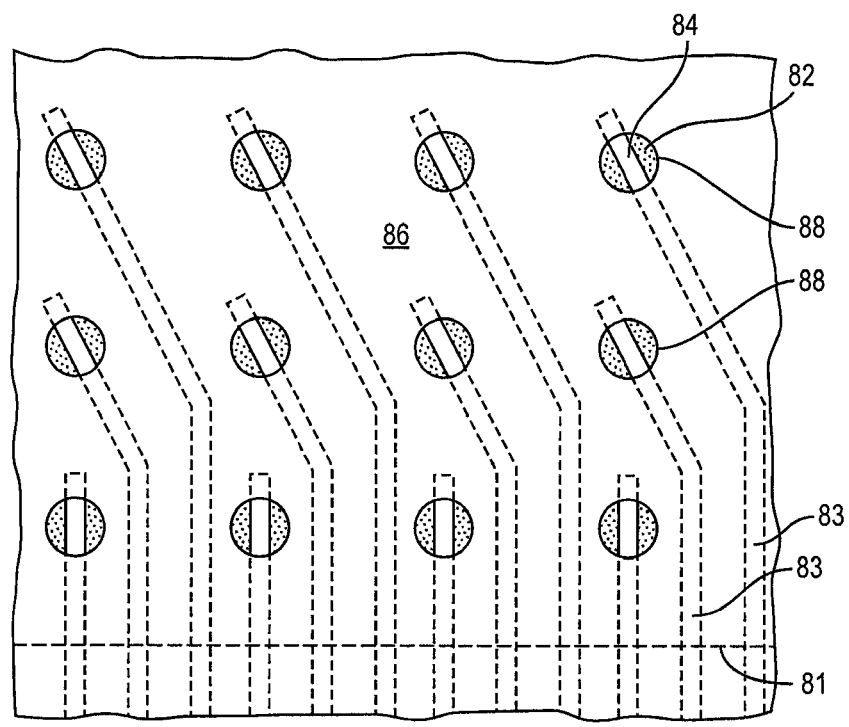
FIGS. 8 and 9 are diagrammatic sketches, each of a portion of another embodiment of a bump-on-narrow-pad flip chip interconnection according to an embodiment of the invention, in a sectional view parallel to the plane of the package substrate surface.
Figure 9:
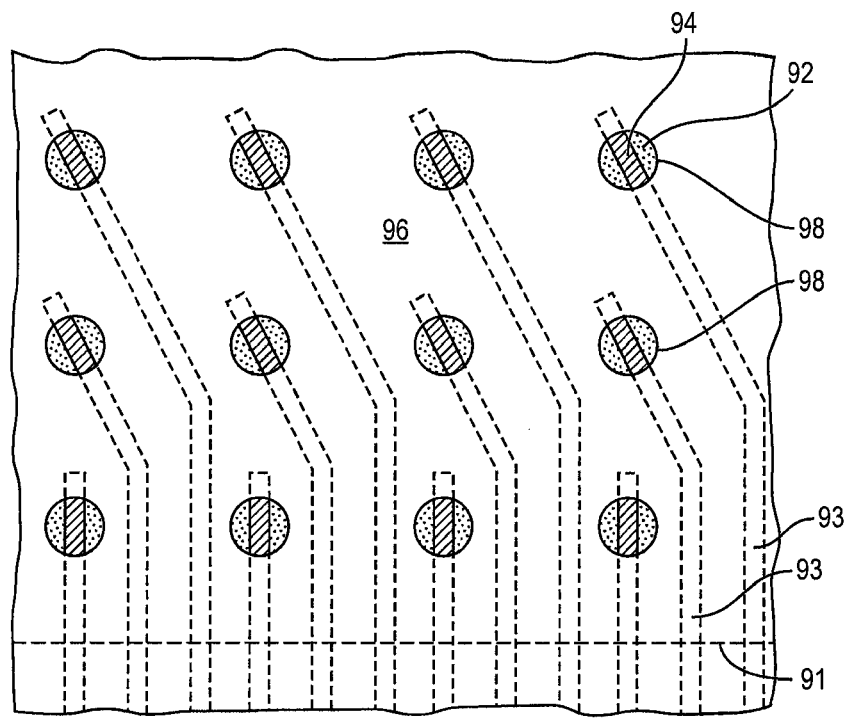

FIGS. 8 and 9 show two examples of a portion of a bump-on-narrow-pad flip chip interconnection according to other embodiments of the invention, in a diagrammatic sectional view taken in a plane parallel to the substrate surface. Certain features are shown as if transparent. According to this aspect of the invention a solder mask is provided, which may have a nominal mask opening diameter in the range about 80 um to 90 um. Solder mask materials can be resolved at such pitches and, particularly, substrates can be made comparatively inexpensively with solder masks having 90 um openings and having alignment tolerances plus or minus 25 um. In some embodiments laminate substrates (such as 4 metal layer laminates), made according to standard design rules, are used. In the embodiments of FIGS. 8 and 9, for example, the traces may be at .about.90 um pitch and the narrow pads may be in a 270 um area array, providing an effective escape pitch .about.90 um across the edge of the die footprint, indicated by the broken line 81.

In embodiments as in FIGS. 8 and 9 a no-flow underfill is not required; a conventional capillary underfill can be employed.

In embodiments as in FIG. 8 the interconnection is achieved by mating the bumps directly onto an narrow interconnect pad 84 on a narrow lead or trace 83 patterned on a dielectric layer on the die attach surface of the substrate 82; the solder mask 86 serves to limit flow of solder within the bounds of the mask openings 88, preventing solder flow away from the interconnect site along the solder-wettable lead. The solder mask may additionally confine flow of molten solder between leads, or this may be accomplished in the course of the assembly process.

In embodiments as in FIG. 9, as in FIG. 8, narrow pads on traces 93 are patterned on a dielectric layer on the die attach surface of the substrate 92. Solder paste is provided at the interconnect sites (narrow pads) 94 on the leads 93, to provide a fusible medium for the interconnect. The openings 98 in the solder mask 96 serve to define the paste. The paste is dispensed, for example by a standard printing process, then is reflowed, and then may be coined if necessary to provide uniform surfaces to meet the balls. The solder paste can be applied in the course of assembly using a substrate as described above with reference to FIG. 8; or, a substrate may be provided with paste suitably patterned prior to assembly. Other approaches to applying solder selectively to the interconnect sites may be employed in the solder-on-narrow-pad embodiments of the invention, including electroless plating and electroplating techniques. The solder-on-narrow-pad configuration provides additional solder volume for the interconnect, and can accordingly provide higher product yield, and can also provide a higher die standoff.

Accordingly, in some embodiments the solder-on-narrow-pad configuration according to the invention is employed for interconnection of a die having high-melting temperature solder bumps (such as a high-lead [high Pb] solder, conventionally used for interconnection with ceramic substrates) onto an organic substrate. The solder paste can be selected to have a melting temperature low enough that the organic substrate is not damaged during reflow. To form the interconnect in such embodiments the high-melting interconnect bumps are contacted with the solder-on-narrow-pad sites, and the remelt fuses the solder-on-narrow-pad to the bumps. Where a noncollapsible bump is used, together with a solder-on-narrow-pad process, no preapplied adhesive is required, as the displacement or flow of the solder is limited by the fact that only a small quantity of solder is present at each interconnect, and the noncollapsible bump prevents collapse of the assembly.

In other embodiments the solder-on-narrow-pad configuration according to the invention is employed for interconnection of a die having eutectic solder bumps.

Figure 10A:
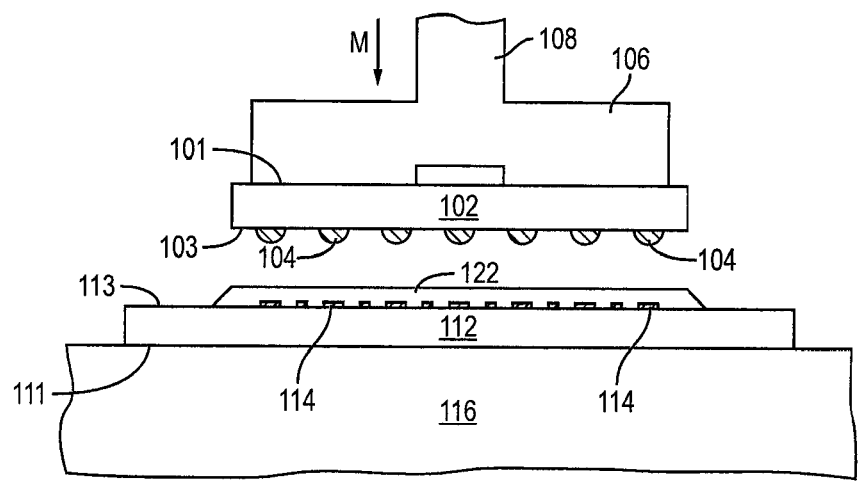
FIGS. 10A-10C are diagrammatic sketches in a sectional view illustrating steps in a process for making a flip chip interconnection according to an embodiment of the invention.
Figure 10B:
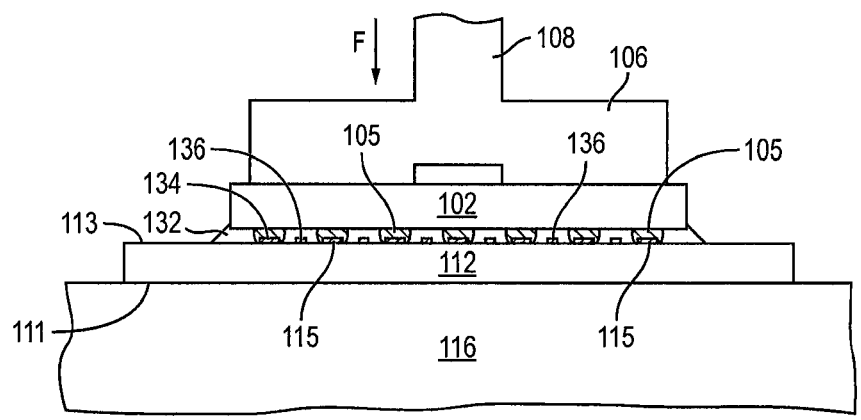
Figure 10C:
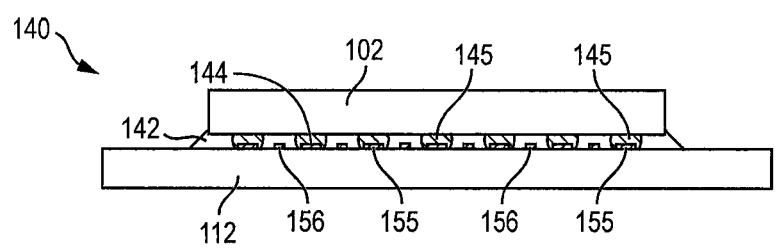

One embodiment of a preferred method for making a bump-on-narrow-pad interconnection is shown diagrammatically in FIGS. 10A-10C.

Referring to the FIGs., a substrate 112 is provided, having at least one dielectric layer and having a metal layer on a die attach surface 113, the metal layer being patterned to provide circuitry, particularly narrow interconnection pads 114 on traces or leads, on the die attach surface. The substrate 112 is supported, for example on a carrier or stage 116, with a substrate surface opposite the die attach surface 113 facing the support. A quantity of an encapsulating resin 122 is dispensed over the die attach surface 113 of the substrate, covering at least the narrow interconnection pads 114 on the leads. A die 102 is provided, having bumps 104 attached to die pads (not shown in the FIG.) on the active side 103. The bumps include a fusible material which contacts the mating surfaces of the narrow pads. A pick-and-place tool 108 including a chuck 106 picks up the die by contact of the chuck 106 with the backside 101 of the die. Using the pick-and-place tool, the die is positioned facing the substrate with the active side of the die toward the die attach surface of the substrate, as shown in FIG. 10A; and the die and substrate are aligned and moved one toward the other (arrow M) so that the bumps 104 contact the corresponding narrow interconnection pads 114 on the traces (leads) on the substrate. Then a force is applied (arrow F) to press the bumps 105 onto the mating surfaces 134 at the narrow pads 115 on the leads, as shown in FIG. 10B. The force must be sufficient at least to displace the adhesive 122 from between the bumps and the mating surfaces 134 at the narrow interconnection pads 115. The bumps may be deformed by the force, breaking the oxide film on the contacting surface of the bumps and/or on the mating surface of narrow pads. The deformation of the bumps may result in the fusible material of the bumps being pressed onto the top and over the edges of the narrow pads. The adhesive is caused to cure at least partially, as shown at 132, as for example by heating to a selected temperature. At this stage the adhesive need only be partially cured, that is, only to an extent sufficient subsequently to prevent flow of molten solder along an interface between the adhesive and the conductive traces. Then the fusible material of the bumps 105 is melted and then is re-solidified, forming a metallurgical interconnection between the bump 105 and narrow pad 115, and the adhesive curing is completed, to complete the die mount and to secure the electrical interconnection at the mating surface (now an interconnect interface) 144, as shown generally at 140 in FIG. 10C. In the plane of the sectional view shown in FIG. 1C, interconnection is formed between certain of the bumps 145 and corresponding narrow interconnection pads 155 on certain of the leads, as for example in a configuration as in FIG. 6. Other leads 156 are interconnected on narrow interconnection pads at other localities, which would be visible in other sectional views. A comparatively high trace density is shown. The curing of the adhesive may be completed prior to, or concurrently with, or following melting the solder. Typically, the adhesive is a thermally curable adhesive, and the extent of curing at any phase in the process is controlled by regulating the temperature. The components can be heated and cured by raising the temperature of the chuck on the pick and place tool, or by raising the temperature of the substrate support, for example.

Figure 11A:
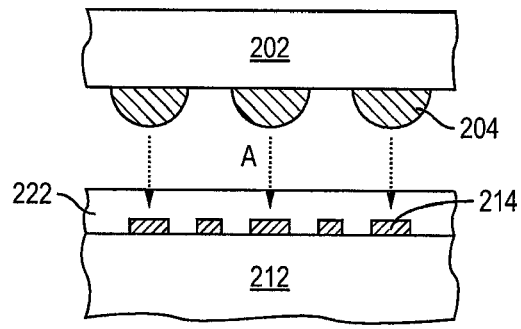
FIGS. 11A-11D are diagrammatic sketches in a sectional view illustrating steps in a process for making a flip chip interconnection according to an embodiment of the invention.
Figure 11B:
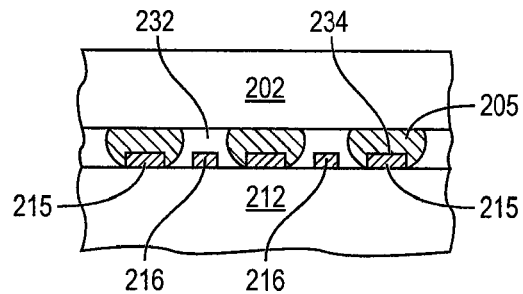
Figure 11C:
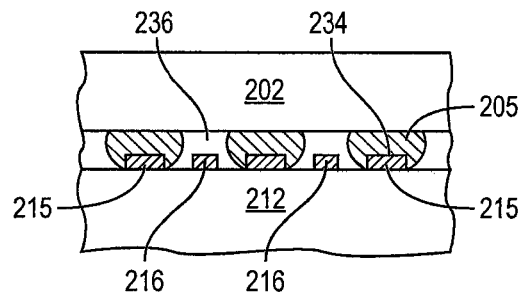
Figure 11D:
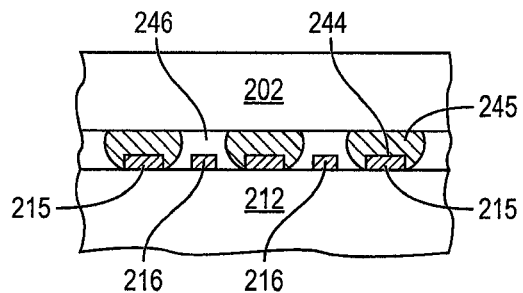

The process is shown in further detail in FIGS. 11A-11D. In FIG. 1A, a substrate 212 is provided on a die attach surface with conductive (metal) traces, and narrow interconnection pads 214 at interconnect sites on the traces are covered with an adhesive 222. The die 202 is positioned in relation to the substrate 212 such that the active side of the die faces the die attach side of the substrate, and is aligned (arrows A) such that bumps 204 on the die are aligned with corresponding mating surfaces on narrow pads 214. The die and the substrate are moved toward one another so that the bumps contact the respective mating surfaces on the narrow pads. Then as shown in FIG. 11B a force is applied to move the bumps 205 and narrow pads 215 against one another, displacing the adhesive as shown at 232 in FIG. 11B, and deforming the bumps onto the mating surfaces 234 and over the edges of the narrow pads. Deformation of the bumps on the narrow pads breaks the oxide film on the contact surfaces of the bumps and the mating surfaces of the narrow pads, establishing a good electrical connection, and deformation of the bumps over the edges of the narrow pads helps establish a good temporary mechanical connection. As in the example of FIG. 10A-10C, the narrow interconnection pads of certain of the traces 216 are out of the plane of FIG. 11B. Heat is applied to partially cure the adhesive as shown at 236 in FIG. 11C. Then heat is applied to raise the temperature of the bumps sufficiently to cause the fusible material of the bumps to melt, as shown in FIG. 11D. This substantially (though not necessarily fully) completes the cure of the adhesive 246 and completes the metallurgical interconnection of the bumps 245 onto the mating surfaces 244 at the narrow interconnection pads 215. The cured adhesive stabilizes the die mount.

In an alternative embodiment of a preferred method, the adhesive can be pre-applied to the die surface, or at least to the bumps on the die surface, rather than to the substrate. The adhesive can, for example, be pooled in a reservoir, and the active side of the die can be dipped in the pool and removed, so that a quantity of the adhesive is carried on the bumps; then, using a pick-and-place tool, the die is positioned facing a supported substrate with the active side of the die toward the die attach surface of the substrate, and the die and substrate are aligned and moved one toward the other so that the bumps contact the corresponding traces (leads) on the substrate. Such a method is described in U.S. Pat. No. 6,780,682, Aug. 24, 2004, which is hereby incorporated by reference. Then forcing, curing, and melting are carried out as described above.

Figure 12:
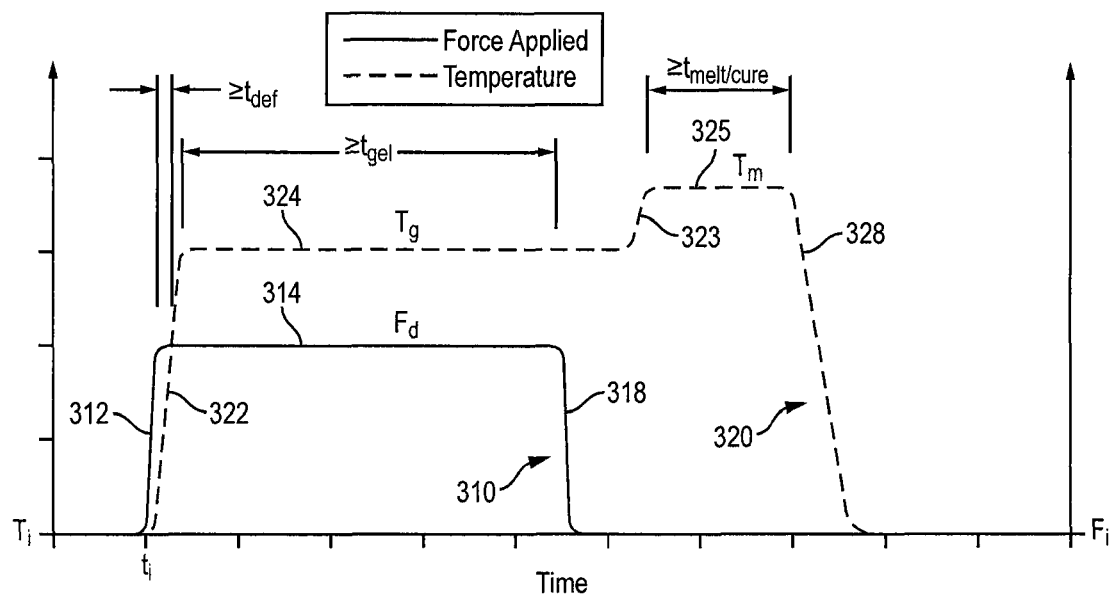
FIG. 12 is a diagrammatic sketch showing a force and temperature schedule for a process for making a flip chip interconnection according to an embodiment of the invention.

A force and temperature schedule for a process according to the invention is shown diagrammatically by way of example in FIG. 12. In this chart, time runs from left to right on the horizontal axis; a force profile 310 is shown as a thick solid line, and a temperature profile 320 is shown as a dotted line. The temperature profile begins at a temperature in the range about 80° C.-about 90° C. The force profile begins at essentially zero force. Beginning at an initial time $t_i$ the force is rapidly (nearly instantaneously) raised 312 from $F_i$ to a displacement/deformation force $F_d$ and held 314 at that force for a time, as discussed below. $F_d$ is a force sufficiently great to displace the adhesive away from between the bumps and the mating surfaces of the narrow interconnection pads; and, preferably, sufficient to deform the fusible (narrow pad-contacting) portion of the bumps onto the mating surface, breaking the oxide films and forming a good metal-to-metal (metallurgical) contact, and, in some embodiments, over the edges of the narrow pads to establish a mechanical interlock of the bumps and the narrow pads ("creep" deformation). The total amount of force required will depend upon the bump material and dimensions and upon the number of bumps, and can be determined without undue experimentation. As the force is raised, the temperature is also rapidly raised 322 from an initial temperature $T_i$ to a gel temperature Tg. The gel temperature Tg is a temperature sufficient to partially cure the adhesive (to a "gel"). Preferably, the force and temperature ramps are set so that there is a short lag time $t_{def}$ following the moment when $F_d$ is reached and before $T_g$ is reached, at least long enough to permit the elevated force to displace the adhesive and to deform the bumps before the partial cure of the adhesive commences. The assembly is held 314, 324 at the displacement/deformation pressure $F_d$ and at the gel temperature $T_g$ for a time $t_{gel}$ sufficient to effect the partial cure of the adhesive. The adhesive should become sufficiently firm that it can subsequently maintain a good bump profile during the solder remelt phase—that is, sufficiently firm to prevent undesirable displacement of the molten fusible material of the bump, or flow of the molten fusible material along the narrow pads and leads. Once the adhesive has partially cured to a sufficient extent, the pressure may be ramped down rapidly 318 to substantially no force (weight of the components). The temperature is then rapidly raised further 323 to a temperature $T_m$ sufficient to remelt the fusible portions (solder) of the bumps, and the assembly is held 325 at the remelt temperature $T_m$ for a time $t_{melt/cure}$ at least sufficient to fully form the solder remelt on the narrow pads, and preferably sufficient to substantially (though not necessarily fully) cure the adhesive. Then the temperature is ramped down 328 to the initial temperature $T_i$, and eventually to ambient. The process outlined in FIG. 12 can run its course over a time period of 5-10 seconds.

The adhesive in embodiments as in FIG. 12 may be referred to as a "no-flow underfill". In some approaches to flip chip interconnection, the metallurgical interconnection is formed first, and then an underfill material is flowed into the space between the die and the substrate. The "no-flow underfill" according to the invention is applied before the die and the substrate are brought together, and the no-flow underfill is displaced by the approach of the bumps onto the narrow pads, and by the opposed surfaces of the die and the substrate. The adhesive for the no-flow underfill adhesive according to the invention is preferably a fast-gelling adhesive—that is, a material that gels sufficiently at the gel temperature in a time period in the order of 1-2 seconds. Preferred materials for the no-flow underfill adhesive include, for example, so-called non-conductive pastes, such as those marketed by Toshiba Chemicals and by Loktite-Henkel, for example.

Alternative bump structures may be employed in the bump-on-narrow-pad interconnects according to the invention. Particularly, for example, so-called composite solder bumps may be used. Composite solder bumps have at least two bump portions, made of different bump materials, including one which is collapsible under reflow conditions, and one which is substantially non-collapsible under reflow conditions. The non-collapsible portion is attached to the interconnect site on the die; typical conventional materials for the non-collapsible portion include various solders having a high lead (Pd) content, for example; and gold (Au), for example. The collapsible portion is joined to the non-collapsible portion, and it is the collapsible portion that makes the connection with the narrow interconnect pad according to the invention. Typical conventional materials for the collapsible portion of the composite bump include eutectic solders, for example.

Figure 13:
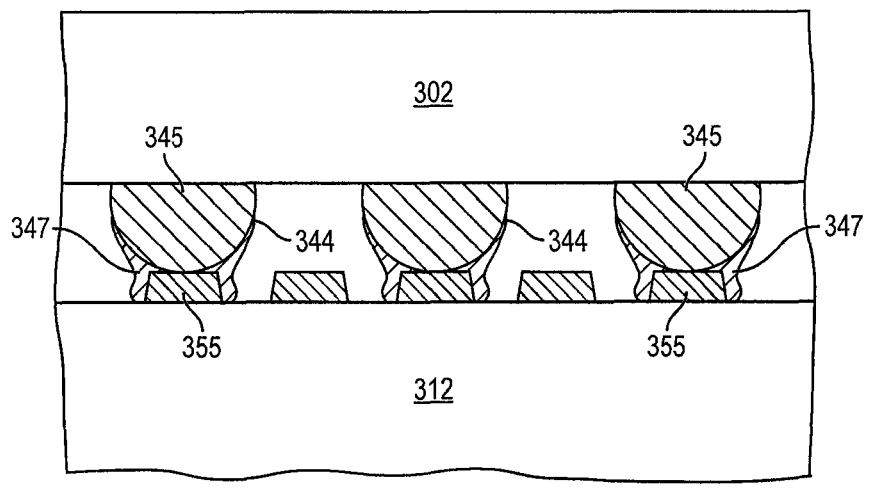
FIG. 13 is a diagrammatic sketch in a sectional view showing a bump-on-narrow-pad flip chip interconnection according to an embodiment of the invention.

An example of a bump-on-narrow-pad interconnect employing a composite bump is shown in a diagrammatic sectional view in FIG. 13. Referring now to FIG. 13, die 302 is provided on die pads in the active side of the die with composite bumps that include a noncollapsible portion 345 and a collapsible portion 347. The collapsible portion may be, for example, a eutectic solder or a relatively low temperature melt solder). The collapsible portion contacts the mating surface of the narrow pad and, where deformation of the fusible portion of the bump over the narrow pad is desired, the collapsible portion of the bump is deformable under the conditions of force employed. The noncollapsible portion may be, for example, a solder having a high lead (Pb) content. The noncollapsible portion does not deform when the die is moved under pressure against the substrate during processing, and does not melt during the reflow phase of the process. Accordingly the noncollapsible portion can be dimensioned to provide a standoff distance between the active surface of the die and the die attach surface of the substrate.

As may be appreciated, the bumps in embodiments as shown in, for example, FIGS. 4, 5, 6 and 7 need not necessarily be fully collapsible bumps. The structures shown in those FIGs. may alternatively be made using composite bumps, or using non-collapsible bumps (high-Pb, or Au) in a solder-on-narrow-pad method, as described above.

And, as may be appreciated in view of the foregoing, an interconnect as appears for example in FIG. 13 can be formed by bringing a non-composite non-collapsible bump (high-Pb, Au) into contact with a narrow interconnect pad provided on the mating surface with a fusible material (such as, for example, a eutectic solder or a relatively low temperature melt solder, which may be provided as a solder paste). Or, the narrow interconnect pad may be provided on the mating surface with a fusible material and the bumps may be composite bumps, also provided with a collapsible (fusible) portion.

Where the narrow interconnect pads are provided on the mating surface with a fusible material, it may be preferred to employ a solder mask, followed by a capillary underfill, in the process.

Other embodiments are within the following claims.

What is claimed:

1. A method of making a semiconductor device, comprising:
   forming a first conductive layer over a semiconductor die;
   forming a second conductive layer over a substrate; and
   forming an interconnect structure between the first conductive layer and an interconnect site of the second conductive layer, wherein a first width of the second conductive layer at the interconnect site is greater than a second width of the second conductive layer away from the interconnect site and less than a width of a contact interface between the interconnect structure and first conductive layer.

2. The method of claim 1, wherein the contact interface of the interconnect structure includes a circular shape.

3. The method of claim 1, wherein the interconnect site includes a rectangular, elongated, circular, semicircular, rounded, or elliptical shape.

4. The method of claim 1, wherein the first width of the second conductive layer at the interconnect site is less than 50 micrometers.

5. The method of claim 1, wherein the interconnect structure includes a non-fusible portion disposed around a fusible portion.

6. The method of claim 1, wherein the interconnect structure includes a non-fusible portion and fusible portion with the fusible portion extending over a side surface of the second conductive layer.

7. A method of making a semiconductor device, comprising:
   forming a first conductive layer over a semiconductor die;
   forming a second conductive layer over a substrate; and
   disposing a composite bump including a non-fusible portion and fusible portion between the first conductive layer and an interconnect site of the second conductive layer with the fusible portion extending over a side surface of the interconnect site, wherein a width of the interconnect site is less than a width of the first conductive layer and a length of the interconnect site is greater than the width of the first conductive layer.

8. The method of claim 7, wherein the width of the interconnect site is less than 80% of a width of a contact interface between the composite bump and first conductive layer.

9. The method of claim 8, wherein the contact interface of the composite bump includes a circular shape.

10. The method of claim 7, wherein the width of the interconnect site is less than 120% of a width of the second conductive layer away from the interconnect site.

11. The method of claim 7, wherein the width of the interconnect site is greater than a width of the second conductive layer away from the interconnect site.

12. The method of claim 7, wherein the width of the interconnect site is less than 50 micrometers.

13. A method of making a semiconductor device, comprising:
   forming a first conductive layer over a semiconductor die;
   forming a second conductive layer over a substrate; and
   forming an interconnect structure between the first conductive layer and an interconnect site on the second conductive layer, wherein a length of the interconnect site is equal to or greater than a width of a contact interface between the interconnect structure and first conductive layer and a width of the interconnect site is greater than a width of the second conductive layer away from the interconnect site.

14. The method of claim 13, wherein a width of the interconnect site is less than 80% of a width of the first conductive layer.

15. The method of claim 13, wherein the contact interface of the interconnect structure includes a circular shape.

16. The method of claim 13, wherein the interconnect site includes a rectangular, elongated, circular, semicircular, rounded, or elliptical shape.

17. The method of claim 13, wherein a width of the interconnect site is less than 50 micrometers.

18. The method of claim 13, wherein the interconnect structure includes a non-fusible portion and fusible portion.

19. A semiconductor device, comprising:
   a semiconductor die;
   a first conductive layer formed over an active surface of the semiconductor die;
   a substrate;
   a second conductive layer formed over the substrate; and
   a composite bump including a non-fusible portion and fusible portion disposed between the first conductive layer and an interconnect site on the second conductive layer, the fusible portion of the composite bump extending over a side surface of the second conductive layer.

20. The semiconductor device of claim 19, wherein a width of the interconnect site is less than 80% of a width of a contact interface between the composite bump and first conductive layer.

21. The semiconductor device of claim 19, wherein a width of the interconnect site is greater than a width of the second conductive layer away from the interconnect site.

22. The semiconductor device of claim 19, wherein the interconnect site includes a rectangular, elongated, circular, semicircular, rounded, or elliptical shape.

23. The semiconductor device of claim 19, wherein a width of the interconnect site is less than 50 micrometers.

24. A semiconductor device, comprising:
   a substrate;
   a conductive layer formed over the substrate; and
   an interconnect structure including a non-fusible portion and fusible portion disposed over a widened portion of the conductive layer, the fusible portion of the interconnect structure extending over a side surface of the conductive layer.

25. The semiconductor device of claim 24, further including:
   a semiconductor die; and
   a contact pad formed over the semiconductor die, wherein the semiconductor die is mounted to the substrate with the contact pad disposed over the interconnect structure opposite the widened portion of the conductive layer.

26. The semiconductor device of claim 24, wherein a first width of the conductive layer at the widened portion of the conductive layer is greater than a second width of the conductive layer away from the widened portion of the conductive layer.

27. The semiconductor device of claim 24, wherein the widened portion of the conductive layer includes a rectangular, elongated, circular, semicircular, rounded, or elliptical shape.

* * * * *